(12) United States Patent
Ilchenko et al.

(10) Patent No.: US 11,811,187 B2
(45) Date of Patent: *Nov. 7, 2023

(54) NON-RECIPROCAL OPTICAL ASSEMBLY FOR INJECTION LOCKED LASER

(71) Applicant: GM Cruise Holdings LLC, San Francisco, CA (US)

(72) Inventors: Vladimir Ilchenko, Arcadia, CA (US); Lutfollah Maleki, Pasadena, CA (US); Ivan Grudinin, South Pasadena, CA (US)

(73) Assignee: GM CRUISE HOLDINGS LLC, San Francisco, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/742,377

(22) Filed: May 11, 2022

(65) Prior Publication Data
US 2022/0271492 A1    Aug. 25, 2022

Related U.S. Application Data

(63) Continuation of application No. 16/588,313, filed on Sep. 30, 2019, now Pat. No. 11,362,479.

(51) Int. Cl.
*H01S 3/10*  (2006.01)
*H01S 3/08*  (2023.01)
(Continued)

(52) U.S. Cl.
CPC ...... *H01S 3/10092* (2013.01); *H01S 3/08054* (2013.01); *H01S 3/10084* (2013.01);
(Continued)

(58) Field of Classification Search
CPC .............. H01S 5/0656; H01S 5/10084; H01S 5/10092; H01S 5/4006; H01S 3/10084;
(Continued)

(56) References Cited

U.S. PATENT DOCUMENTS 4,884,276 A    11/1989   Dixon et al.
10,418,783 B1   9/2019   Vuletic et al.
(Continued)

FOREIGN PATENT DOCUMENTS

CN    1388614 A    1/2003
CN    101911403 A   12/2010
(Continued)

OTHER PUBLICATIONS

"International Search Report for PCT Patent Application No. PCT/US2019/068752", dated Jul. 10, 2020, 5 Pages.
(Continued)

*Primary Examiner* — Tod T Van Roy
*Assistant Examiner* — Delma R Fordé
(74) *Attorney, Agent, or Firm* — CALFEE, HALTER & GRISWOLD LLP

(57) ABSTRACT

A non-reciprocal optical assembly for injection locking a laser to a resonator is described. The laser emits a light beam, and the resonator receives the light beam and returns a feedback light beam to the laser such that the feedback light beam causes injection locking. The non-reciprocal optical assembly is interposed between and optically coupled to the laser and the resonator. The non-reciprocal optical assembly includes a first port that receives the light beam from the laser, and a second port that outputs the light beam to the resonator and receives the feedback light beam from the resonator. The first port also outputs the feedback light beam to the laser. The light beam passes through the non-reciprocal optical assembly with a first power loss, and the feedback light beam passes through the non-reciprocal optical assembly with a second power loss (the first power loss differs from the second power loss).

20 Claims, 8 Drawing Sheets

(51) Int. Cl.
| H01S 5/065 | (2006.01) |
| H01S 5/00 | (2006.01) |
| G02B 27/10 | (2006.01) |
| G02B 27/14 | (2006.01) |

(52) U.S. Cl.
CPC .......... H01S 5/0078 (2013.01); H01S 5/0656 (2013.01); *G02B 27/10* (2013.01); *G02B 27/1006* (2013.01); *G02B 27/1086* (2013.01); *G02B 27/14* (2013.01)

(58) Field of Classification Search
CPC ...... H01S 3/10092; G02B 27/10–1093; G02B 27/14–149
See application file for complete search history.

(56) References Cited

U.S. PATENT DOCUMENTS

| 2006/0203324 | A1 | 9/2006 | Harris et al. |
| 2011/0255094 | A1 | 10/2011 | Mohageg et al. |
| 2013/0003766 | A1 | 1/2013 | Savchenkov et al. |
| 2015/0318951 | A1 | 11/2015 | Zhang et al. |
| 2016/0299228 | A1 | 10/2016 | Maleki et al. |
| 2021/0098961 | A1 | 4/2021 | Ilchenko et al. |

FOREIGN PATENT DOCUMENTS

| CN | 104040808 | A | 9/2014 |
| CN | 107567592 | A | 1/2018 |
| CN | 114731024 | A | 7/2022 |
| EP | 4005042 | A1 | 6/2022 |
| WO | 2009064934 | A2 | 5/2009 |
| WO | 2011119232 | A2 | 9/2011 |
| WO | 2016164435 | A1 | 10/2016 |
| WO | 2019096408 | A1 | 5/2019 |
| WO | 2021066864 | A1 | 4/2021 |

OTHER PUBLICATIONS

"Written Opinion of the International Searching Authority for PCT Patent Application No. PCT/US2019/068752", dated Jul. 10, 2020, 12 Pages.

Matsko, et al., "Tunable, Agile RF Photonic Source", In 2015 IEEE Photonics Conference, Oct. 4, 2015, pp. 386-387.

Yasuda, et al., "Pressent status of the development of an Yb optical lattice clock at NMIJ/AIST (National Metrology Institute of Japan / National Institute of Advanced Industrial Science and Technology", In Time and Frequency Metrology, vol. 6673, Jan. 1, 2017, 8 Pages.

Steinmetz, et al., "Reduction of timing jitter in passively Q-switched microchip lasers using self-injection seeding", In Optical Letters, Optical Society of America, vol. 35, No. 17, Sep. 1, 2010, pp. 2885-2887.

Vassiliev, et al., "Narrow-line-width diode laser with a high-Q microsphere resonator", In Optics Communications, vol. 158, Dec. 15, 1998, pp. 305-312.

"Office Action for U.S. Appl. No. 16/588,313", dated Sep. 29, 2021, 26 pages.

"Response to the Office Action for U.S. Appl. No. 16/588,313", filed Dec. 21, 2021, 14 pages.

"Notice of Allowance and Fees Due for U.S. Appl. No. 16/588,313", dated Mar. 11, 2022, 12 pages.

Galiev, et al., "Mirror-Assisted Self-Injection Locking of a Laser to a Whispering-Gallery-Mode Microresonator", In Physical Review Applied, American Physical Society, vol. 16, No. 064043, 2021, pp. 064043-1-064043-11.

"Novel Lasers: Whispering-Gallery-Mode Resonators Create Ultranarrow-Linewidth Semiconductor Lasers", In Lasers and Sources, Oct. 7, 2014, 14 pages.

"Communication Pursuant to Rules 161(1) and 162 EPC for European Patent Application No. 19842555.5", dated Mar. 15, 2022, 3 pages.

"International Preliminary Report for PCT Patent Application No. PCT/US2019/068752", dated Apr. 5, 2022, 13 Pages.

"Notification of Entry into the Substantive Examination Procedure for Chinese Patent Application No. 2019801011216", dated Aug. 25, 2022, 2 pages.

"Request for Substantive Examination for Chinese Patent Application No. 2019801011216", Filed Date: Aug. 18, 2022, 5 pages.

"Response to Communication Pursuant to Rules 161(1) and 162 EPC for European Patent Application No. 19842555.5", Filed Date: Sep. 22, 2022, 29 pages.

"Voluntary Amendment for Chinese Patent Application No. 2019801011216", Filed Date: Aug. 18, 2022, 14 pages.

"Communication Under Rule 71(3) EPC for European Patent Application No. 19842555.5", dated Feb. 8, 2023, 38 pages.

NON-RECIPROCAL OPTICAL ASSEMBLY FOR INJECTION LOCKED LASER

CROSS-REFERENCE TO RELATED APPLICATION

This application is a continuation of U.S. patent application Ser. No. 16/588,313, filed on Sep. 30, 2019, and entitled "NON-RECIPROCAL OPTICAL ASSEMBLY FOR INJECTION LOCKED LASER", the entirety of which is incorporated herein by reference.

BACKGROUND

Various conventional architectures employ a laser that is injection locked to a resonator. For instance, the laser can emit a light beam that is sent to the resonator. The laser and the resonator are optically coupled, such that the light beam from the laser is provided to the resonator, circulates inside the resonator undergoing total internal reflection, and is provided back from the resonator to the laser. When injection locked, the frequency of the laser is a slave to the frequency of the resonator (e.g., the resonator can cause the laser to emit a light beam at substantially similar frequency as compared to the frequency of the resonator).

An exemplary resonator that can be utilized for injection locking is a high quality factor (Q) whispering gallery mode resonator. Due to electrooptic properties and size of such a resonator, frequency of a whispering gallery mode resonator can be linearly modulated with a relatively narrow linewidth. According to an example, a voltage in a sawtooth waveform applied to the resonator can cause the laser injection locked to the resonator to emit a light beam with a frequency that follows the sawtooth waveform.

To enable the laser to be injection locked to the resonator, a specific fraction of power of the light beam emitted by the laser is to be returned back to the laser. For example, a total power loss for the light beam emitted from the laser and returned back to the laser of approximately 25 dB can provide stable conditions where the laser remains injection locked to the resonator. However, if the light beam incident upon the resonator is at an elevated power level, operating characteristics of the resonator may be altered which can lead to detrimental effects, such as thermo-optical frequency pulling and photorefractive damage. For instance, an elevated power level of the light beam incident upon the resonator can cause a semi-permanent change to a refractive index of the material from which the resonator is formed, which can impact calibration of a system that employs the laser injection locked to the resonator as a light source. Accordingly, various conventional approaches employ the laser operating at a modest power level so as to cause the power level of the light beam incident upon the resonator to be at a level below which detrimental effects are encountered. Further, since the laser is operating at a modest power level, these conventional approaches oftentimes boost the outputted injection locked light beam by employing booster optical amplifiers (BOAs).

SUMMARY

The following is a brief summary of subject matter that is described in greater detail herein. This summary is not intended to be limiting as to the scope of the claims.

Described herein are various technologies that pertain to injection locking a laser to a resonator via a non-reciprocal optical assembly. The laser can be configured to emit a light beam. Moreover, the resonator can be configured to receive the light beam emitted by the laser and return a feedback light beam to the laser such that the feedback light beam causes injection locking of the laser to the resonator. The non-reciprocal optical assembly can be interposed between and optically coupled to the laser and the resonator. The non-reciprocal optical assembly can include a first port configured to receive the light beam from the laser, and a second port configured to output the light beam to the resonator. Moreover, the second port is configured to receive the feedback light beam from the resonator, and the first port is configured to output the feedback light beam to the laser. The light beam can pass through the non-reciprocal optical assembly from the first port to the second port with a first power loss. Further, the feedback light beam can pass through the non-reciprocal optical assembly from the second port to the first port with a second power loss, where the first power loss differs from the second power loss (e.g., the first power loss can be greater than the second power loss). The non-reciprocal optical assembly can further include a third port configured to output an injection locked light beam.

According to various embodiments, the non-reciprocal optical assembly can include a Faraday plate, a first half-wave plate, a polarization beam splitter, and a second half-wave plate. The first half-wave plate can be optically coupled to the Faraday plate, the polarization beam splitter can be optically coupled to the first half-wave plate, and the second half-wave plate can be optically coupled to the polarization beam splitter. A path of the light beam through the non-reciprocal optical assembly can pass through the Faraday plate, then the first half-wave plate, then the polarization beam splitter, and then the second half-wave plate. Moreover, a path of the feedback light beam through the non-reciprocal optical assembly can pass through the second half-wave plate, then the polarization beam splitter, then the first half-wave plate, and then the Faraday plate.

The non-reciprocal optical assembly enables the laser to be injection locked to the resonator without detrimentally impacting the resonator while the laser operates at higher power levels as compared to many conventional architectures. For instance, a power level of a light beam incident upon the resonator can be below a level that causes thermo-optical frequency pulling or photorefractive damage. Moreover, the non-reciprocal optical assembly enables outputting an injection locked light beam at a power level that need not be boosted (e.g., via a booster optical amplifier, for use in a lidar sensor system).

The above summary presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

DETAILED DESCRIPTION

Figure 1:
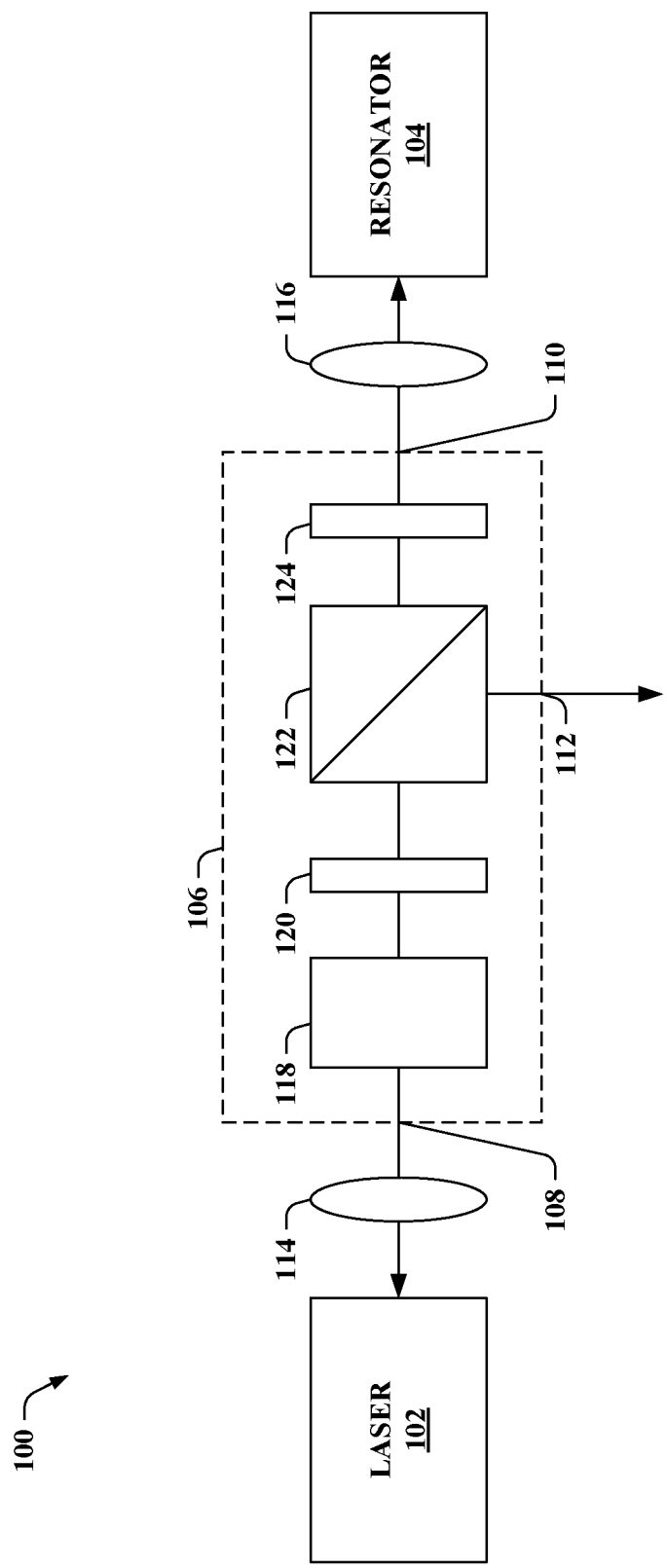
FIG. 1 illustrates an exemplary system configured to injection lock a laser to a resonator.

Various technologies pertaining to non-reciprocal optical assemblies for injection locked lasers are now described with reference to the drawings, wherein like reference numerals are used to refer to like elements throughout. In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diagram form in order to facilitate describing one or more aspects. Further, it is to be understood that functionality that is described as being carried out by certain system components may be performed by multiple components. Similarly, for instance, a component may be configured to perform functionality that is described as being carried out by multiple components.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

As used herein, the terms "component" and "system" are intended to encompass computer-readable data storage that is configured with computer-executable instructions that cause certain functionality to be performed when executed by a processor. The computer-executable instructions may include a routine, a function, or the like. The terms "component" and "system" are also intended to encompass one or more optical elements that can be configured or coupled together to perform various functionality with respect to an optical signal. It is also to be understood that a component or system may be localized on a single device or distributed across several devices. Further, as used herein, the term "exemplary" is intended to mean "serving as an illustration or example of something."

As used herein, and unless the context dictates otherwise, the term "coupled to" is intended to include both direct coupling (in which two elements that are coupled to each other contact each other) and indirect coupling (in which at least one additional element is located between the two elements).

Referring now to the drawings, FIG. 1 illustrates an exemplary system 100 configured to injection lock a laser 102 to a resonator 104. The system 100 includes the laser 102, the resonator 104, and a non-reciprocal optical assembly 106 interposed between and optically coupled to the laser 102 and the resonator 104. The system 100 can output an injection locked light beam, while the non-reciprocal optical assembly 106 can mitigate thermo-optical frequency pulling and photorefractive damage to the resonator 104 by reducing a power level of a light beam to which the resonator 104 is subjected (as compared to conventional approaches that include a reciprocal beam splitter interposed between a laser and a resonator).

The laser 102 is configured to emit a light beam. The laser 102 can be a semiconductor laser, a laser diode, or the like. According to an example, the laser 102 can be a distributed feedback laser (DFB) laser. The laser 102 can emit the light beam at a higher power as compared to traditional architectures where a laser is injection locked to a resonator with a reciprocal beam splitter interposed between the laser and the resonator.

Moreover, the resonator 104 is configured to receive the light beam emitted by the laser 102 and return a feedback light beam to the laser 102 such that the feedback light beam causes injection locking of the laser 102 to the resonator 104. The resonator 104 can be a whispering gallery mode (WGM) resonator (e.g., a high Q WGM resonator). The resonator 104 can be formed of an electrooptic material. Examples of the electrooptic material include lithium niobite, lithium tantalate, and so forth. Further, the resonator 104 can include an electrode (or electrodes) to which a voltage can be applied. Application of a voltage to the resonator 104 can change an optical property of the electrooptic material of the resonator 104. For instance, application of a voltage to the resonator 104 can change an index of refraction of the electrooptic material of the resonator 104.

The non-reciprocal optical assembly 106 is configured to receive the light beam from the laser 102 and output the light beam to the resonator 104. Moreover, the non-reciprocal optical assembly 106 is configured to receive the feedback light beam from the resonator 104 and output the feedback light beam to the laser 102. More particularly, the non-reciprocal optical assembly 106 includes a first port 108, a second port 110, and a third port 112. The first port 108 is configured to receive the light beam from the laser 102 and the second port 110 is configured to output the light beam to the resonator 104. Moreover, the second port 110 is configured to receive the feedback light beam from the resonator 104 and the first port 108 is configured to output the feedback light beam to the laser 102. Further, the third port 112 is configured to output an injection locked light beam.

The light beam from the laser 102 passes through the non-reciprocal optical assembly 106 from the first port 108 to the second port 110 with a first power loss. Further, the feedback light beam from the resonator 104 passes through the non-reciprocal optical assembly 106 from the second port 110 to the first port 108 with a second power loss. Due to the non-reciprocal natural of the non-reciprocal optical assembly 106, the first power loss differs from the second power loss. According to various embodiments, the first power loss can be greater than the second power loss. Thus, the light beam from the laser 102 and the feedback light beam from the resonator 104 can experience different power losses passing through the non-reciprocal optical assembly 106 (e.g., depending on propagation direction through the non-reciprocal optical assembly 106).

The laser 102 is optically injection locked to the resonator 104. Since the laser 102 is optically injection locked to the resonator 104, a voltage applied to the resonator 104 can impart a frequency change on the laser 102. Moreover, injection locking of the laser 102 to the resonator 104 can narrow a linewidth of the light beam emitted by the laser 102, confine the light beam to a single mode, and so forth.

Thus, the voltage applied to the resonator 104 can be utilized to control frequency of the injection locked light beam outputted via the third port 112 of the non-reciprocal optical assembly 106 (e.g., the injection locked light beam can be or include an optical chirp for a lidar sensor system generated by applying a voltage waveform to the resonator 104).

It is contemplated that various optical components can be on an optical path between the laser 102 and the non-reciprocal optical assembly 106. Likewise, various optical components can be on an optical path between the non-reciprocal optical assembly 106 and the resonator 104. For instance, as depicted in FIG. 1, a lens 114 can be interposed between the laser 102 and the non-reciprocal optical assembly 106, and a lens 116 can be interposed between the non-reciprocal optical assembly 106 and the resonator 104. However, it is to be appreciated that the claimed subject matter is not so limited, as other component(s) can additionally or alternatively be on such optical paths. Moreover, it is contemplated that the system 100 need not include any optical components between the laser 102 and the non-reciprocal optical assembly 106 and/or between the non-reciprocal optical assembly 106 and the resonator 104 (e.g., the system 100 can lack the lens 114 and/or the lens 116).

As depicted in the example of FIG. 1, the non-reciprocal optical assembly 106 can include a Faraday plate 118, a first half-wave plate 120, a polarization beam splitter 122, and a second half-wave plate 124. The Faraday plate 118 can be optically coupled to the first half-wave plate 120, the first half-wave plate 120 can be optically coupled to the polarization beam splitter 122, and the polarization beam splitter 122 can be optically coupled to the second half-wave plate 124. Accordingly, a path of the light beam (emitted by the laser 102 and received at the first port 108 of the non-reciprocal optical assembly 106) through the non-reciprocal optical assembly 106 passes through the Faraday plate 118, then the first half-wave plate 120, then the polarization beam splitter 122, and then the second half-wave plate 124; the light beam is then outputted from the non-reciprocal optical assembly 106 via the second port 110. Moreover, a path of the feedback light beam (returned by the resonator 104 and received at the second port 110 of the non-reciprocal optical assembly 106) through the non-reciprocal optical assembly 106 passes through the second half-wave plate 124, then the polarization beam splitter 122, then the first half-wave plate 120, and then the Faraday plate 118; the feedback light beam is then outputted from the non-reciprocal optical assembly 106 via the first port 108.

The Faraday plate 118 is configured to non-reciprocally rotate polarization angles of the light beam and the feedback light beam based on propagation directions of the light beam and the feedback light beam through the Faraday plate 118. For example, the Faraday plate 118 can rotate a polarization angle of an incoming beam by +45 degrees non-reciprocally depending on a direction of propagation through the Faraday plate 118 (e.g., polarization angle of the light beam can be rotated +45 degrees and polarization angle of the feedback light beam can also be rotated +45 degrees). Further, the polarization beam splitter 122 is configured to reflect a vertical polarization light beam (e.g., a vertical polarization portion of the light beam, a vertical polarization portion of the feedback light beam) and transmit a horizontal polarization light beam (e.g., a horizontal polarization portion of the light beam, a horizontal polarization portion of the feedback light beam). The vertical polarization light beam reflected by the polarization beam splitter 122 can be outputted as the injection locked light beam via the third port 112. Moreover, the horizontal polarization light beam transmitted by the polarization beam splitter 122 can be directed towards either the resonator 104 or the laser 102 (e.g., the horizontal polarization portion of the light beam can be directed towards the resonator 104, the horizontal polarization portion of the feedback light beam can be directed towards the laser 102).

Moreover, the first half-wave plate 120 is configured to reciprocally rotate polarization angles of the light beam and the feedback light beam by an arbitrary angle. Likewise, the second half-wave plate 124 is configured to reciprocally rotate polarization angles of the light beam and the feedback light beam by an arbitrary angle. For example, the first half-wave plate 120 can rotate the polarization angle of the light beam by +40 degrees and can rotate the polarization angle of the feedback light beam by −40 degrees. According to another example, the second half-wave plate 124 can rotate the polarization angle of the light beam by +90 degrees and can rotate the polarization angle of the feedback light beam by −90 degrees. Yet, it is contemplated that other angles are intended to fall within the scope of the hereto appended claims, and thus, the claimed subject matter is not limited to the foregoing examples.

Further, it is contemplated that the non-reciprocal optical assembly 106 can be tunable to control the first power loss of the light beam passing through the non-reciprocal optical assembly 106 from the first port 108 to the second port 110. A percentage of power of the light beam received via the first port 108 that is transmitted via the second port 110 can be adjusted. For example, the percentage of power that is transmitted by the non-reciprocal optical assembly 106 can be adjusted in a range between 0.5% and 3.0%; however, the claimed subject matter is not so limited. Tuning of the non-reciprocal optical assembly 106 can be achieved without defocusing or decoupling as commonly performed with conventional approaches.

According to an example, rotation of the first half-wave plate 120 can control tuning of the first power loss. Rotation of the first half-wave plate 120 alters an angle that the half-wave plate 120 rotates a polarization angle of light passing therethrough. Thus, adjusting the orientation (e.g., rotation) of the first half-wave plate 120 allows for tuning the power of the light beam transmitted by the polarization beam splitter 122, and accordingly, optical feedback that is provided back to the laser 102.

Figure 2:
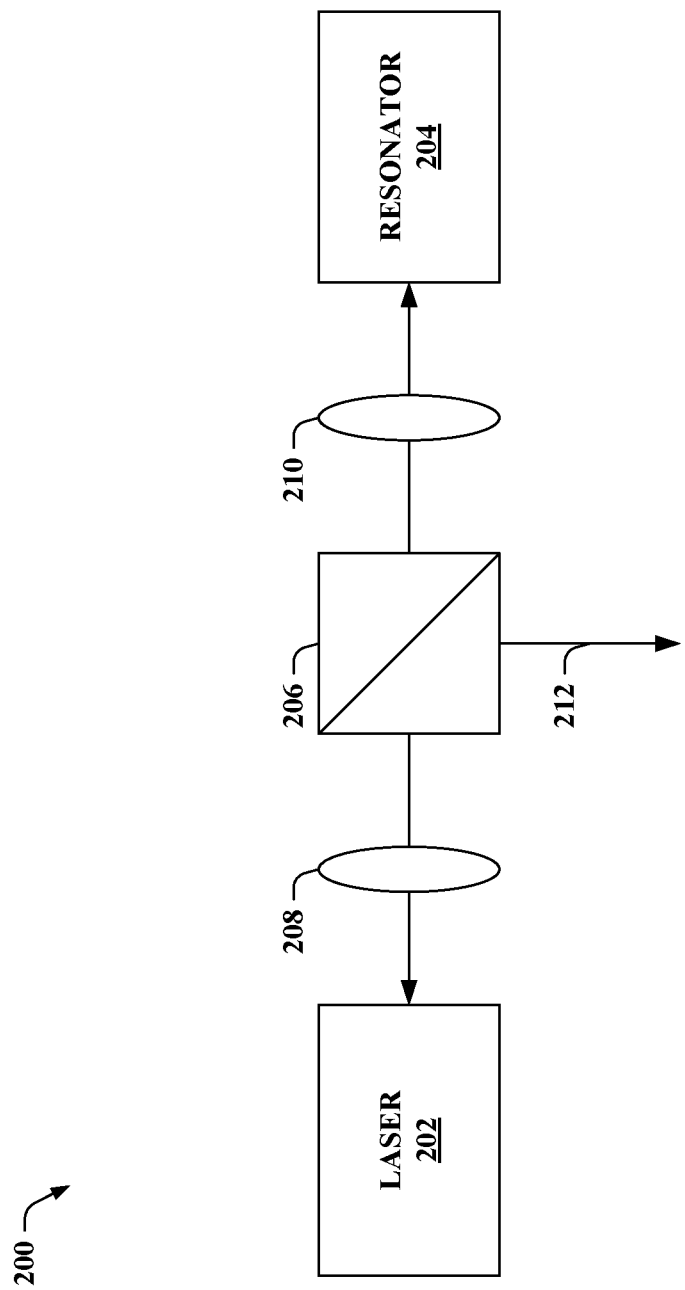
FIG. 2 illustrates an example of a conventional system for injection locking a laser to a resonator.

Now turning to FIG. 2, illustrated is an example of a conventional system 200 for injection locking a laser 202 to a resonator 204. The system 200 includes the laser 202, the resonator 204, and a reciprocal beam splitter 206 interposed between and optically coupled to the laser 202 and the resonator 204. The laser 202 can be substantially similar to the laser 102, and the resonator 204 can be substantially similar to the resonator 104. Moreover, in the example depicted in FIG. 2, a lens 208 is interposed between the laser 202 and the reciprocal beam splitter 206, and a lens 210 is interposed between the reciprocal beam splitter 206 and the resonator 204.

A power loss for a light beam propagating from the laser 202 to the resonator 204 through the reciprocal beam splitter 206 (as well as other optical elements such as the lens 208 and 210) can be substantially similar to a power loss for a feedback light beam propagating from the resonator 204 to the laser 202 through the reciprocal beam splitter 206 (as well as the other optical elements). Accordingly, a power level of the light beam incident upon the resonator 204 can cause detrimental effects to the resonator 204, such as thermo-optical frequency pulling and/or photorefractive damage, when the laser 202 is operated at an elevated power level. Moreover, when the laser 202 is operated at a lower power level, an injection locked light beam 212 outputted by the reciprocal beam splitter 206 may need to be boosted (e.g., via a booster optical amplifier (BOA)), which leads to increased complexity and cost of such conventional architectures.

Figure 3:
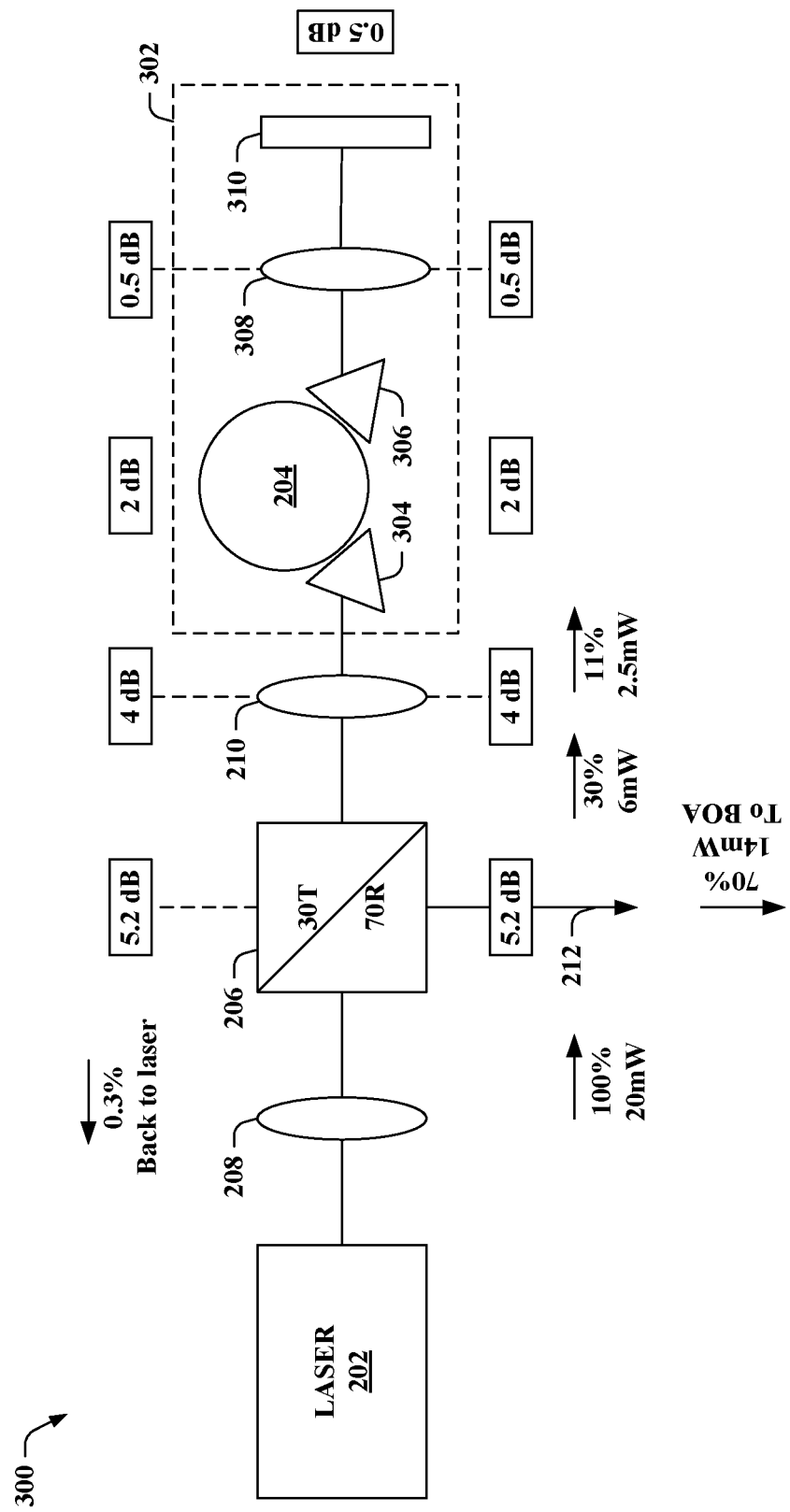
FIGS. 3-4 illustrate exemplary implementations of the conventional system of FIG. 2 for injection locking the laser to the resonator.
Figure 4:
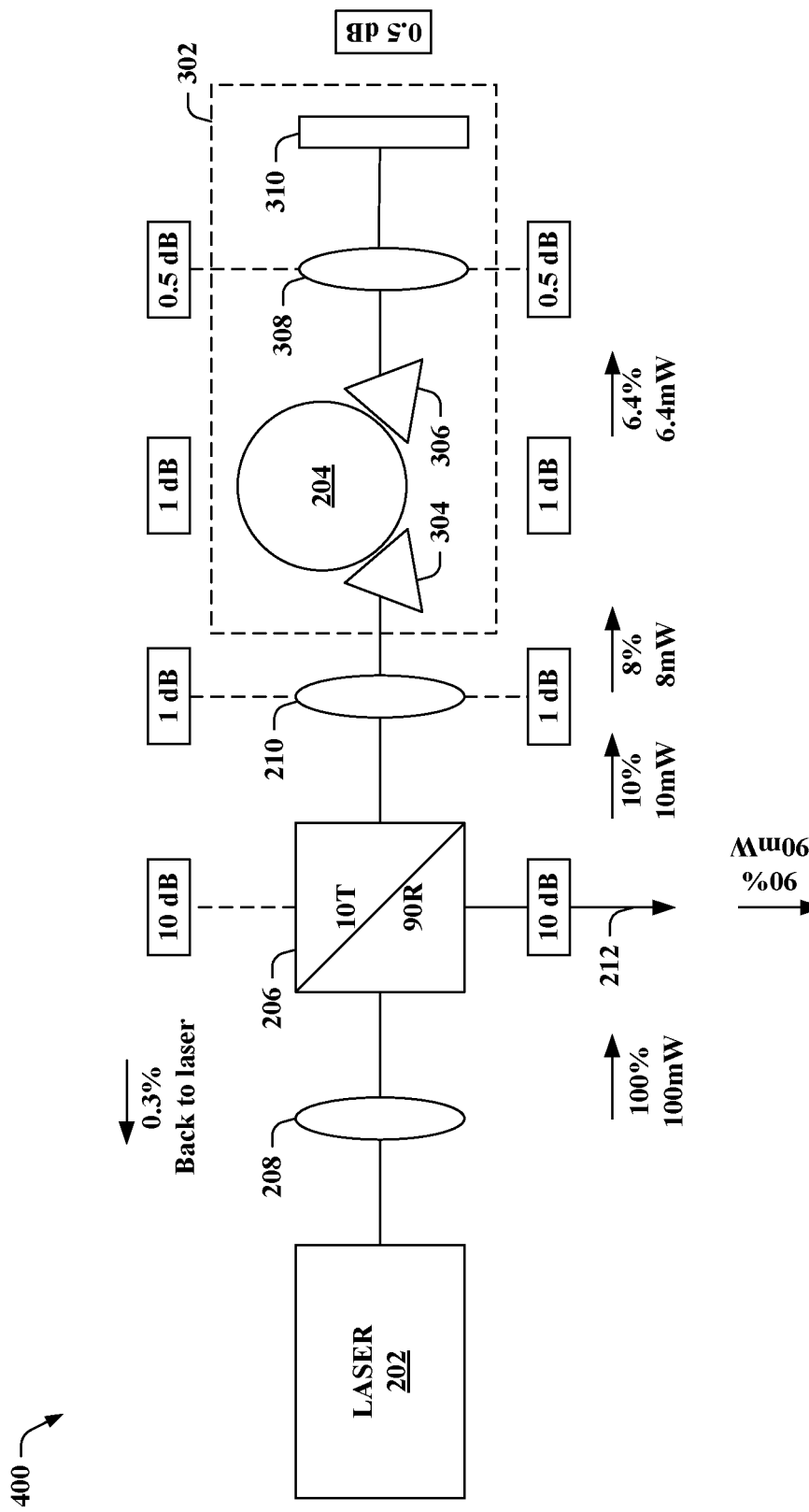

FIGS. 3-4 illustrate exemplary implementations of the conventional system 200 for injection locking the laser 202 to the resonator 204. Similar to FIG. 2, the exemplary systems depicted in FIGS. 3-4 include the laser 202, the resonator 204, the reciprocal beam splitter 206, the lens 208, and the lens 210. The resonator 204 is included as part of a resonator module 302 in the systems shown in FIGS. 3-4; it is contemplated that the resonator 104 of FIG. 1 can likewise be included as part of a similar resonator module.

According to the depicted examples, the resonator module 302 includes a first optical coupler 304 located in an optical path of the light beam emitted by the laser 202. The first optical coupler 304 couples at least a portion of the light beam into the resonator 204. Moreover, the resonator module 302 includes a second optical coupler 306, a lens 308, and a feedback optics device 310 (e.g., a mirror). The second optical coupler 306 can couple at least a portion of light circulating in the resonator 204 out along an optical path that passes through the lens 308. The light can be reflected by the feedback optics device 310. The reflected light can pass through the lens 308 and at least a portion of the reflected light can be coupled into the resonator 204 by the second optical coupler 306. The first optical coupler 304 further couples at least a portion of the reflected light circulating in the resonator 204 out of the resonator 204 as a feedback light beam.

FIG. 3 depicts an exemplary system 300 in which the reciprocal beam splitter 206 divides an optical beam into two beams, where 30% of the power of the optical beam incident upon the reciprocal beam splitter 206 is transmitted as a first beam and 70% of the power of the optical beam incident upon the reciprocal beam splitter 206 is reflected as a second beam. The first beam (30% of the power of the incident optical beam) is transmitted through the reciprocal beam splitter 206 and the second beam (70% of the power of the incident optical beam) is reflected by the reciprocal beam splitter 206 (e.g., outputted as the injection locked light beam 212). Accordingly, the reciprocal beam splitter 206 splits the light beam emitted by the laser 202 such that 30% of the power of the light beam is directed towards the resonator 204 for optical injection locking via optical feedback, while 70% of the power of the light beam is reflected (e.g., outputted as the injection locked light beam 212). Similarly, the reciprocal beam splitter 206 splits the feedback light beam returned by the resonator 204 such that 30% of the power of the feedback light beam is directed towards the laser 202 for optical injection locking, while 70% of the power of the feedback light beam is reflected.

In the example shown, the laser 202 is operated at a power level of 20 mW, with 2-3 mW reaching the resonator 204. Under such condition, the resonator 204 can remain stable yet can show some manifestations of thermo-optical pulling that can complicate control of the laser 202 (e.g., during operation of a lidar sensor system that includes the laser 202 injection locked to the resonator 204). Further, the second beam reflected by the reciprocal beam splitter 206 (e.g., the injection locked light beam 212) at a power of 14 mW may be inputted to a BOA. The second beam may be boosted to provide an output beam at a sufficient power level for a particular application (e.g., 50-100 mW may be used in a lidar sensor system). Thus, the reciprocal beam splitter 206 in the example of FIG. 3 along with the laser 202 operating at 20 mW can lead to use of a BOA to increase the power of the injection locked light beam 212. Moreover, to maintain injection locking between the laser 202 and the resonator 204, approximately 0.3% of the power of the light beam emitted by the laser 202 is to be returned to the laser 202 after making a round trip through the system 300. Accordingly, the system 300 can have a round trip optical loss of approximately 25 dB.

As shown, the laser 202 emits the light beam at a power level of 20 mW. The light beam passes through the lens 208 and is incident upon the reciprocal beam splitter 206. 30% of the power of the light beam (6 mW) is transmitted by the reciprocal beam splitter 206 and directed towards the resonator 204, whereas 70% of the power of the light beam (14 mW) is reflected by the reciprocal beam splitter 206 (e.g., outputted as the injection locked light beam 212 and directed towards the BOA). Accordingly, the power loss for the light beam passing through the reciprocal beam splitter 206 towards the resonator 204 is 5.2 dB. In the example of FIG. 3, the lens 210 can defocus the light beam such that the light beam passes through the lens 210 with a power loss of 4 dB. Thus, 11% of the power of the light beam emitted by the laser 202 (e.g., 2.5 mW) is incident upon the resonator 204.

Further, the power loss for light passing through the resonator module 302 can be approximately 5 dB. For example, as shown in FIG. 3, the power loss for light passing through the resonator 204 (e.g., propagating from the first optical coupler 304 to the second optical coupler 306) can be 2 dB and the power loss for light passing through the lens 308 (e.g., propagating from the resonator 204 to the feedback optics device 310) can be 0.5 dB. Moreover, the power loss for light reflected by the feedback optics device 310 can be 0.5 dB. The power loss for light passing through the lens 308 (e.g., propagating from the feedback optics device 310 to the resonator 204) can be 0.5 dB and the power loss for light passing through the resonator 204 (e.g., propagating from the second optical coupler 306 to the first optical coupler 304) can be 2 dB.

The resonator 204 can return a feedback light beam towards the laser 202. The power loss for the feedback light beam passing through the lens 210 can be 4 dB. Moreover, the reciprocal beam splitter 206 can transmit 30% of the power of the feedback light beam towards the laser 202, whereas 70% of the power of the feedback light beam can be reflected by the reciprocal beam splitter 206. Accordingly, the power loss for the feedback light beam passing through the reciprocal beam splitter 206 towards the laser 202 is 5.2 dB. The feedback light beam then can pass through the lens 208 and return to the laser 202. Thus, approximately 0.3% of the power of the light beam emitted by the laser 202 can be returned to the laser 202 after making a round trip through the system 300 to maintain injection locking of the laser 202 to the resonator 204.

In the system 300 of FIG. 3, power loss between the laser 202 and the resonator 204 can be substantially similar regardless of propagation direction. Accordingly, the light beam emitted by the laser 202 passes through the reciprocal beam splitter 206 (as well as the lens 208 and 210) with a power loss that is substantially similar to a power loss for the feedback light beam returned by the resonator 204 when passing through the reciprocal beam splitter 206 (as well as the lens 208 and 210).

Some conventional architectures that include the reciprocal beam splitter 206 may be designed so as to provide the injection locked light beam 212 at a power level so that a BOA need not be employed. For instance, FIG. 4 depicts an exemplary system 400 in which the laser 202 operates at an elevated power level relative to the system 300. A power level of the injection locked light beam 212 outputted by the system 400 need not be increased by a BOA for various applications (e.g., a BOA need not be employed in conjunction with the system 400 to increase the power level of the injection locked light beam 212 for a lidar sensor system). However, in the system 400, a power level of the light beam incident upon the resonator 204 may be elevated as compared to the light beam incident upon the resonator 204 in the system 300. The elevated power level of the light beam incident upon the resonator 204 may cause detrimental effects, such as thermo-optic frequency pulling and photorefractive damage.

In the system 400, the reciprocal beam splitter 206 is a smaller ratio beam splitter as compared to the reciprocal beam splitter 206 in the system 300. More particularly, as depicted in FIG. 4, the reciprocal beam splitter 206 divides an optical beam into two beams, where 10% of the power of the optical beam incident upon the reciprocal beam splitter 206 is transmitted as a first beam and 90% of the power of the optical beam incident upon the reciprocal beam splitter 206 is reflected as a second beam. Thus, the reciprocal beam splitter 206 splits the light beam emitted by the laser 202 such that 10% of the power of the light beam is directed towards the resonator 204 for injection locking, while 90% of the power of the light beam is reflected (e.g., outputted as the injection locked light beam 212). The reciprocal beam splitter 206 also splits the feedback light beam returned by the resonator 204 such that 10% of the power of the feedback light beam is directed towards the laser 202 for optical injection locking, while 90% of the power of the feedback light beam is reflected.

In the example depicted in FIG. 4, the laser 202 is operated at a power level of 100 mW, with 8 mW reaching the resonator 204. Approximately 0.3% of the power of the light beam emitted by the laser 202 is to be returned to the laser 202 after making a round trip through the system 400 to maintain injection locking of the laser 202 to the resonator 204; thus, the light beam emitted by the laser 202 and thereafter returned to the laser 202 can have a round trip loss of approximately 25 dB. However, the resonator 204 is exposed to elevated power levels of approximately 8 mW in the system 400, which detrimentally impacts the resonator 204 as noted herein.

As depicted in FIG. 4, the laser 202 emits the light beam at a power level of 100 mW. 10% of the power of the light beam (10 mW) is transmitted by the reciprocal beam splitter 206 and directed towards the resonator 204, whereas 90% of the power of the light beam (90 mW) is reflected by the reciprocal beam splitter 206 (e.g., outputted as the injection locked light beam 212 which need not be boosted in this example). Accordingly, the power loss for the light beam passing through the reciprocal beam splitter 206 towards the resonator 204 is 10 dB in the example of FIG. 4. Similar to the example of FIG. 3, the light beam can further pass through the lens 210 and at least a portion of the light beam is optically coupled into the resonator 204 via the first optical coupler 304. Light passes through the resonator module 302, with the resonator 204 returning a feedback light beam towards the laser 202. The feedback light beam can pass through the lens 210 and can be split by the reciprocal beam splitter 206 (e.g., 10% of the power of the feedback light beam being transmitted towards the laser 202 and 90% of the power of the feedback light beam being reflected). Thus, the power loss for the feedback light beam passing through the reciprocal beam splitter 206 towards the laser 202 is 10 dB.

Similar to the system 300 of FIG. 3, in the system 400 the power loss between the laser 202 and the resonator 204 can be substantially similar regardless of propagation direction. Thus, the light beam emitted by the laser 202 passes through the reciprocal beam splitter 206 (as well as the lens 208 and 210) with a power loss that is substantially similar to a power loss for the feedback light beam returned by the resonator 204 when passing through the reciprocal beam splitter 206 (as well as the lens 208 and 210).

Reference is again made to FIG. 1. Similar to the examples set forth in FIGS. 3-4, the light beam emitted by the laser 102 and thereafter returned to the laser 102 can have a round trip loss of approximately 25 dB. Thus, approximately 0.3% of the power of the light beam emitted by the laser 102 is to be returned to the laser 102 after making a round trip through the system 100 to maintain injection locking of the laser 102 to the resonator 104. However, unlike the examples of FIGS. 3-4 where transmission by the reciprocal beam splitter 206 is substantially similar to and from the resonator 204 (e.g., 30% transmission by the reciprocal beam splitter 206 in the system 300 regardless of propagation direction, 10% transmission by the reciprocal beam splitter 206 in the system 400 regardless of propagation direction), transmission through the non-reciprocal optical assembly 106 differs depending on the direction of propagation. For example, the non-reciprocal optical assembly 106 can transmit 1% of the light beam propagating in a direction from the laser 102 towards the resonator 104 and 99% of the feedback light beam propagating in a direction from the resonator 104 towards the laser 102. Following this example, a first power loss when the light beam passes through the non-reciprocal optical assembly 106 from the first port 108 to the second port 110 can be 20 dB, whereas a second power loss when the feedback light beam passes through the non-reciprocal optical assembly 106 from the second port 110 to the first port 108 can be 0.05 dB. Moreover, while many of the examples set forth herein describe a round trip loss of approximately 25 dB, it is to be appreciated that this is provided as an illustration and the claimed subject matter is not so limited; for instance, the round trip loss can be dependent upon parameters of the laser 102.

Pursuant to various examples, it is contemplated that the laser 102 can be configured to emit the light beam at a power greater than 50 mW, and the non-reciprocal optical assembly 106 can be configured to output the light beam to the resonator 104 at a power less than 3 mW. By way of illustration, the laser 102 can emit the light beam at a power of 100 mW. Following this illustration, the injection locked light beam outputted via the third port 112 can be at a power of 99 mW and the light beam outputted via the second port can be at a power of 1 mW. Yet, it is contemplated that an orientation of the first half-wave plate 120 can be adjusted to allow for tuning the foregoing split (e.g., adjusted between 99.5 mW being reflected/0.5 mW being transmitted and 97 mW being reflected/3.0 mW being transmitted).

An example is now set forth where the laser 102 emits the light beam at a power level of 100 mW. It is contemplated, however, that the claimed subject matter is not limited to the following example (e.g., the laser 102 can operate at other power levels). 99% of the power of the light beam incident upon the non-reciprocal optical assembly 106 (99 mW) can be outputted as an injection locked light beam via the third port 112. Accordingly, a power level of the injection locked light beam need not be increased (e.g., a BOA need not be used with the system 100). Moreover, the resonator 104 can be subjected to power less than 1 mW, which can mitigate detrimental effects of thermo-optical frequency pulling and photorefraction.

Figure 5:
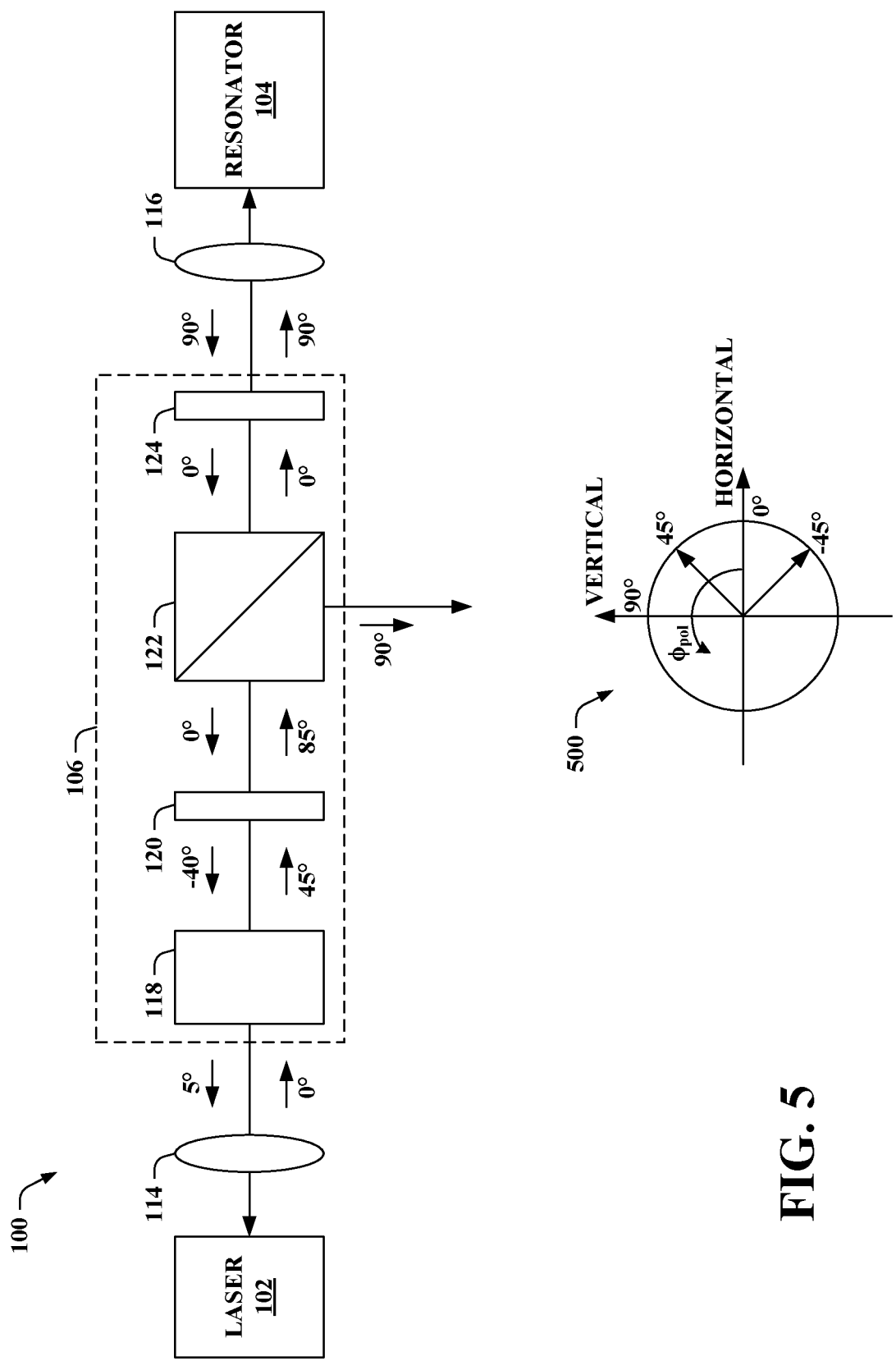
FIG. 5 illustrates an exemplary polarization map within the system of FIG. 1.

Continued reference is made to the example where the laser 102 emits the light beam at a power level of 100 mW. A polarization map within the system 100 is shown in FIG. 5 (e.g., polarization reference and polarization angle ($\phi_{pol}$) definition are depicted at 500). The light beam emitted by the laser 102 can have horizontal polarization. The light beam can pass through the lens 114. Accordingly, the light beam with horizontal polarization (e.g., 0 degrees) can be incident upon the Faraday plate 118. The Faraday plate 118 can non-reciprocally rotate polarization angles based on propagation direction through the Faraday plate 118. For example, the Faraday plate 118 can rotate beam polarization +45 degrees whether propagating from the laser 102 or to the laser 102. Thus, upon passing through the Faraday plate 118, the light beam can have a polarization of +45 degrees.

The light beam is then incident upon the first half-wave plate 120. The first half-wave plate 120 is configured to reciprocally rotate polarization angles; the first half-wave plate 120 can rotate the polarization angle of the light beam propagating from the laser 102 towards the resonator 104 +40 degrees (whereas the first half-wave plate 120 can rotate the polarization angle of the feedback light beam propagating from the resonator 104 towards the laser 102 −40 degrees). After passing through the first half-wave plate 120, the light beam from the laser 102 has a polarization at +85 degrees from horizontal. The light beam is incident on the polarization beam splitter 122, which transmits horizontal polarization (e.g., approximately 1% or 1 mW of the power of the light beam incident on the polarization beam splitter 122) and reflects vertical polarization (e.g., approximately 99% or 99 mW of the power of the light beam incident on the polarization beam splitter 122). Thus, the injection locked light beam has vertical polarization (e.g., +90 degrees). Further, the portion of the light beam transmitted by the polarization beam splitter 122 towards the resonator 104 has horizontal polarization (e.g., 0 degrees). For instance, to leave 1% of incident power of the polarization beam splitter 122 in horizontal polarization, the polarization angle can be approximately sqrt(0.01)[rad] (e.g., roughly +85 degrees).

The light beam from the laser 102 then passes through a second half-wave plate 124 configured to reciprocally rotate polarization angles; the second half-wave plate 124 can rotate a polarization angle of the light beam propagating from the laser 102 towards the resonator +90 degrees (whereas the second half-wave plate 124 can rotate the polarization angle of the feedback light beam propagating from the resonator 104 towards the laser 102 −90 degrees). After the light beam propagating from the laser 102 passes through the second half-wave plate 124, the light beam can have vertical polarization (e.g., +90 degrees) and can pass through the lens 116. Thereafter the light beam with vertical polarization can enter the resonator 104 (e.g., a resonator module that includes the resonator 104, which can be substantially similar to the resonator module 302 of FIG. 3).

The light can experience losses in the lens 116 and the resonator module (e.g., approximately 5 dB). Further, the resonator 104 can return the feedback light beam, which can pass through the lens 116. The feedback light beam incident upon the second half-wave plate 124 an have vertical polarization (e.g., +90 degrees). The second half-wave plate 124 can rotate the polarization angle of the feedback light beam −90 degrees; thus, horizontal polarization can be restored by the second half-wave plate 124. The feedback light beam with the horizontal polarization can pass through the polarization beam splitter 122 with little or no loss. Thereafter, the first half-wave plate 120 can rotate the polarization angle of the feedback light beam −40 degrees upon passing through the first half-wave plate 120.

Moreover, the Faraday plate 118 can rotate the polarization angle of the feedback light beam by +45 degrees; accordingly, the feedback light beam that passes through the Faraday plate 118 can have a polarization of +5 degrees (close to horizontal polarization of the light beam emitted by the laser 102). Thus, the light beam emitted by the laser 102 can be returned back to the laser 102 with approximately 25 dB of return loss, including approximately 20 dB of loss when propagating from the laser 102 towards the resonator 104, and less loss (e.g., approximately 0.05 dB) when propagating from the resonator 104 towards the laser 102. The foregoing can allow for injection locking conditions while operating the resonator 104 at lower power levels (compared to the approaches described above in FIGS. 2-4) and delivering a substantially amount of power (e.g., 99%) as the outputted injection locked light beam (e.g., for a lidar sensor system).

Reference is again made to FIG. 1. The system 100 can be utilized for various applications. For example, a lidar sensor system can include the system 100. Following this example, the laser 102 injection locked to the resonator 104 can be a source configured to generate an optical chirp (e.g., the injection locked light beam) for the lidar sensor system. However, it is contemplated that the system 100 can also be used as part of other systems that use compact, narrow linewidth lasers. For instance, the system 100 can be part of a vibrometer system, a tomography system, a sensing system, or the like.

Figure 6:
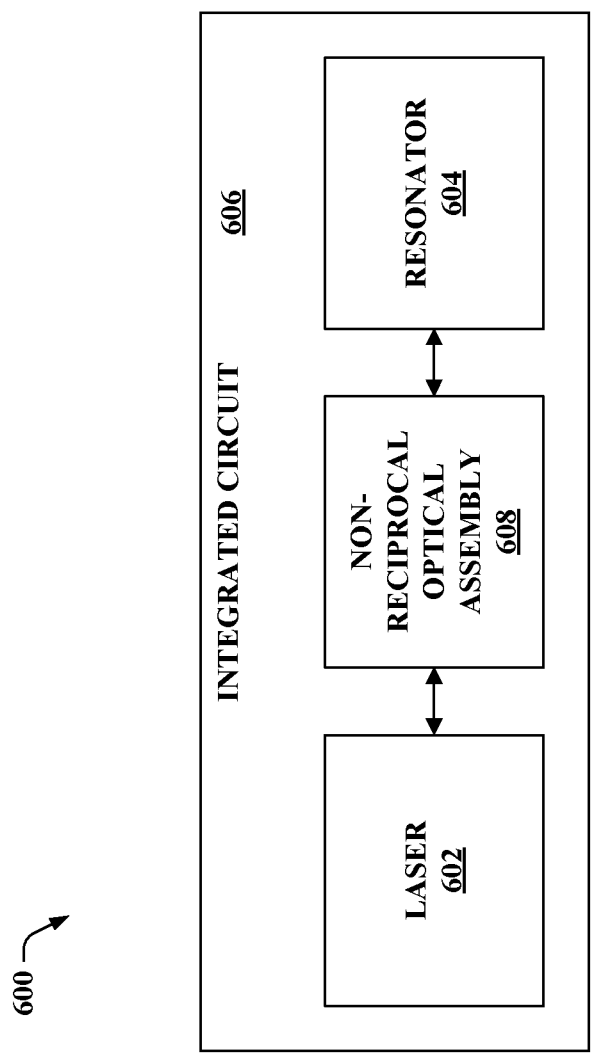
FIG. 6 illustrates another exemplary system that includes a laser injection locked to a resonator.

Now turning to FIG. 6, illustrated is another exemplary embodiment of a system 600 that includes a laser 602 injection locked to a resonator 604. More particularly, the system 600 includes an integrated circuit 606. The integrated circuit 606 can include the laser 602, the resonator 604, and a non-reciprocal optical assembly 608 integrated as part of the integrated circuit 606. Moreover, it is to be appreciated that other elements be similarly be integrated as part of the integrated circuit 606. Further, the integrated circuit 606 can be formed of a material such as, for example, silicon, silicon nitride, or the like.

Rather than including discrete element as in the examples set forth above, the laser 602, the resonator 604, and the non-reciprocal optical assembly 608 can be part of the integrated circuit 606. Similar to above, the laser 604 can emit a light beam, which is received by the non-reciprocal optical assembly 608. The non-reciprocal optical assembly 608 can further output the light beam to the resonator 604 and receive a feedback light beam from the resonator 604. Moreover, the non-reciprocal optical assembly 608 can output the feedback light beam to the laser 602. The light beam propagating towards the resonator 604 can pass through the non-reciprocal optical assembly 608 with a first power loss, and the feedback light beam propagating towards the laser 602 can pass through the non-reciprocal optical assembly 608 with a second power loss, where the first power loss differs from the second power loss.

Figure 7:
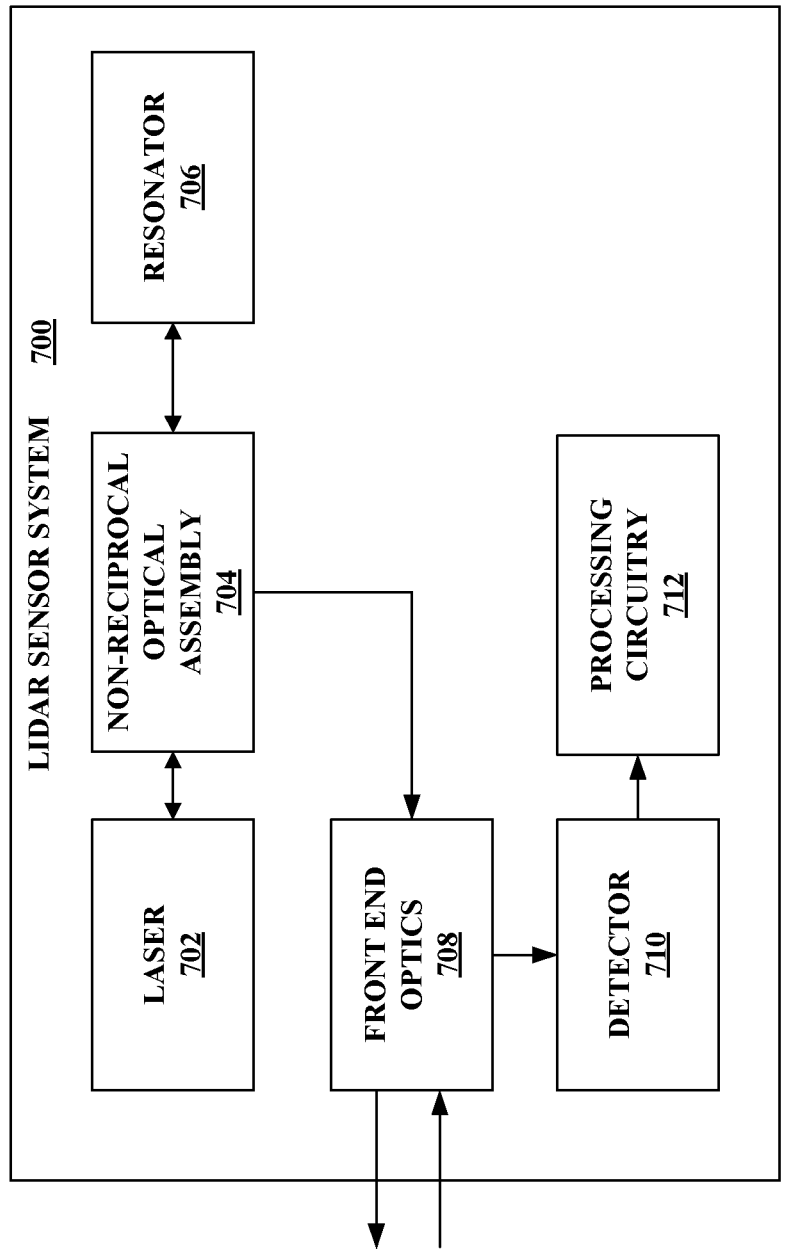
FIG. 7 illustrates a block diagram of an exemplary lidar sensor system that includes a laser injection locked to a resonator.

With reference to FIG. 7, illustrated is an exemplary lidar sensor system 700. The lidar sensor system 700 can be a frequency modulated continuous wave (FMCW) lidar sensor system; however, the claimed subject matter is not so limited. The lidar sensor system 700 includes a laser 702, a non-reciprocal optical assembly 704, and a resonator 706. The non-reciprocal optical assembly 704 is interposed between and optically coupled to the laser 702 and the resonator 706. The non-reciprocal optical assembly 704 can be the non-reciprocal optical assembly 106 of FIGS. 1 and 5, the non-reciprocal optical assembly 608 of FIG. 6, or the like. Moreover, the laser 702 can be the laser 102, the laser 602, or the like. Further, the resonator 706 can be the resonator 104, the resonator 604, or the like.

The resonator 706 can include electrodes to which a voltage can be applied. Application of a voltage to the resonator 706 can change an optical property of the electrooptic material of the resonator 706. For instance, application of a voltage can change an index of refraction of the electrooptic material of the resonator 706. The laser 702 is optically injection locked to the resonator 706. Since the laser 702 is optically injection locked to the resonator device 706, a voltage applied to the resonator 706 can impart a frequency change on the laser 702.

The lidar sensor system 700 further includes front end optics 708 configured to transmit, into an environment of the lidar sensor system 700, at least a portion of an injection locked light beam outputted via the non-reciprocal optical assembly 704 generated by the laser 702 injection locked to the resonator 706. According to various examples, the front end optics 708 can include a scanner, which can direct an optical signal (e.g., the injection locked light beam) over a field of view in the environment. The front end optics 708 can also include other optical elements, such as one or more lenses, an optical isolator, one or more waveguides, an optical amplifier, an interferometer, and so forth. Such optical elements can enable generating the optical signal with desired properties such as collimation, divergence angle, linewidth, power, and the like. Such optical elements may be assembled discretely, or integrated on a chip, or in a combination of both. The front end optics 708 can also be configured to receive a reflected optical signal from the environment. The reflected optical signal can correspond to at least a part of the optical signal transmitted into the environment that reflected off an object in the environment.

Moreover, the lidar sensor system 700 can include a detector 710 (e.g., a photodetector) and processing circuitry 712. The detector 710 can be configured to mix the reflected optical signal received by the front end optics 708 with a local oscillator portion of the injection locked light beam generated by the laser 702 injection locked to the resonator 706. The processing circuitry 712 can be configured to compute distance and velocity data of the object in the environment based on output of the detector 710.

Figure 8:
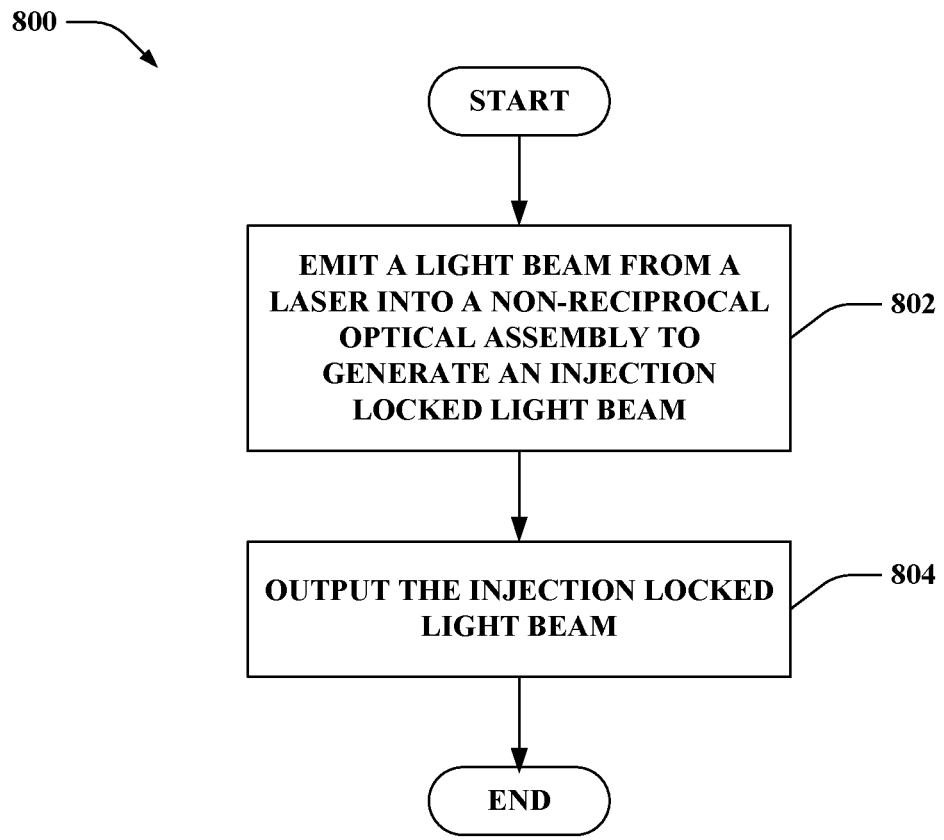
FIG. 8 is a flow diagram that illustrates an exemplary methodology of injection locking a laser to a resonator.

FIG. 8 illustrates an exemplary methodology related to injection locking a laser to a resonator. While the methodology is shown and described as being a series of acts that are performed in a sequence, it is to be understood and appreciated that the methodology is not limited by the order of the sequence. For example, some acts can occur in a different order than what is described herein. In addition, an act can occur concurrently with another act. Further, in some instances, not all acts may be required to implement the methodology described herein.

FIG. 8 illustrates a methodology 800 of injection locking a laser to a resonator. At 802, a light beam can be emitted from the laser into a non-reciprocal assembly. The light beam can pass through the non-reciprocal optical assembly to the resonator with a first power loss. The resonator can return a feedback light beam to the laser such that the feedback light beam passes through the non-reciprocal optical assembly to the laser with a second power loss. Further, the feedback light beam can cause injection locking of the laser to the resonator to generate an injection locked light beam. Moreover, the first power loss differs from the second power loss (e.g., the first power loss is greater than the second power loss). At 804, the injection locked light beam can be outputted. For instance, the injection locked light beam can be transmitted into an environment (as an optical chirp for a lidar sensor system).

What has been described above includes examples of one or more embodiments. It is, of course, not possible to describe every conceivable modification and alteration of the above devices or methodologies for purposes of describing the aforementioned aspects, but one of ordinary skill in the art can recognize that many further modifications and permutations of various aspects are possible. Accordingly, the described aspects are intended to embrace all such alterations, modifications, and variations that fall within the scope of the appended claims. Furthermore, to the extent that the term "includes" is used in either the details description or the claims, such term is intended to be inclusive in a manner similar to the term "comprising" as "comprising" is interpreted when employed as a transitional word in a claim.

What is claimed is:

1. A non-reciprocal optical assembly, comprising:
 a first port configured to receive a light beam; and
 a second port configured to output the light beam and receive a feedback light beam;
 wherein the first port is further configured to output the feedback light beam;
 wherein a first path of the light beam passes through the non-reciprocal optical assembly from the first port to the second port, and a second path of the feedback light beam passes through the non-reciprocal optical assembly from the second port to the first port; and
 wherein the light beam has a first power loss propagating along the first path, the feedback light beam has a second power loss propagating along the second path, and the first power loss is greater than the second power loss.

2. The non-reciprocal optical assembly of claim 1, further comprising:
 a third port configured to output an injection locked light beam.

3. The non-reciprocal optical assembly of claim 2, wherein the injection locked light beam is outputted at the third port with a power level in a range of 97.0% and 99.5% of an input power level of the light beam received at the first port.

4. The non-reciprocal optical assembly of claim 1, further comprising:
 a Faraday plate configured to non-reciprocally rotate polarization angles of the light beam and the feedback light beam based on propagation directions of the light beam and the feedback light beam through the Faraday plate.

5. The non-reciprocal optical assembly of claim 1, wherein the first power loss is tunable.

6. The non-reciprocal optical assembly of claim 5, wherein the first power loss is tunable in a range between 97.0% and 99.5%.

7. The non-reciprocal optical assembly of claim 1, further comprising:
 a half-wave plate configured to reciprocally rotate polarization angles of the light beam and the feedback light beam, wherein rotation of the half-wave plate controls tuning of the first power loss.

8. The non-reciprocal optical assembly of claim 1, wherein the light beam is received from a laser and outputted to a resonator, and the feedback light beam is received from the resonator and outputted to the laser.

9. The non-reciprocal optical assembly of claim 8, wherein the laser is injection locked to the resonator.

10. The non-reciprocal optical assembly of claim 1, further comprising:
a polarization beam splitter configured to:
reflect vertical polarization portions of the light beam and the feedback light beam; and
transmit horizontal polarization portions of the light beam and the feedback light beam.

11. The non-reciprocal optical assembly of claim 1, further comprising:
a Faraday plate;
a first half-wave plate optically coupled to the Faraday plate;
a polarization beam splitter optically coupled to the first half-wave plate; and
a second half-wave plate optically coupled to the polarization beam splitter;
wherein the first path of the light beam through the non-reciprocal optical assembly passes through the Faraday plate, then the first half-wave plate, then the polarization beam splitter, and then the second half-wave plate; and
wherein the second path of the feedback light beam through the non-reciprocal optical assembly passes through the second half-wave plate, then the polarization beam splitter, then the first half-wave plate, and then the Faraday plate.

12. A system, comprising:
a laser configured to emit a light beam;
a resonator configured to receive the light beam emitted by the laser and return a feedback light beam to the laser such that the feedback light beam causes injection locking of the laser to the resonator; and
a non-reciprocal optical assembly interposed between and optically coupled to the laser and the resonator, the non-reciprocal optical assembly comprises:
a first port configured to receive the light beam from the laser; and
a second port configured to output the light beam to the resonator and receive the feedback light beam from the resonator;
wherein the first port is further configured to output the feedback light beam to the laser;
wherein the light beam passes through the non-reciprocal optical assembly from the first port to the second port with a first power loss, the feedback light beam passes through the non-reciprocal optical assembly from the second port to the first port with a second power loss, the first power loss is tunable, and the first power loss differs from the second power loss; and
wherein the non-reciprocal optical assembly non-reciprocally rotates a polarization angle of the light beam passing through the non-reciprocal optical assembly from the first port to the second port relative to a polarization angle of the feedback light beam passing through the non-reciprocal optical assembly from the second port to the first port.

13. The system of claim 12, wherein the first power loss is greater than the second power loss.

14. The system of claim 12, wherein the first power loss is tunable in a range between 97.0% and 99.5%, and the second power loss is tunable in a range between 0.5% and 3.0%.

15. The system of claim 12, wherein the non-reciprocal optical assembly comprises a half-wave plate configured to reciprocally rotate polarization angles of the light beam and the feedback light beam, wherein rotation of the half-wave plate controls tuning of the first power loss.

16. The system of claim 12, further comprising:
a third port configured to output an injection locked light beam;
wherein the laser is configured to emit the light beam at a power greater than 50 mW, and a power of the injection locked light beam outputted at the third port is tunable in a range between 97.0% and 99.5% of the power of the light beam.

17. The system of claim 12, wherein the non-reciprocal optical assembly comprises a polarization beam splitter configured to:
reflect vertical polarization portions of the light beam and the feedback light beam; and
transmit horizontal polarization portions of the light beam and the feedback light beam.

18. The system of claim 12, wherein the non-reciprocal optical assembly comprises:
a Faraday plate;
a first half-wave plate optically coupled to the Faraday plate;
a polarization beam splitter optically coupled to the first half-wave plate; and
a second half-wave plate optically coupled to the polarization beam splitter;
wherein a path of the light beam through the non-reciprocal optical assembly passes through the Faraday plate, then the first half-wave plate, then the polarization beam splitter, and then the second half-wave plate; and
wherein a path of the feedback light beam through the non-reciprocal optical assembly passes through the second half-wave plate, then the polarization beam splitter, then the first half-wave plate, and then the Faraday plate.

19. The system of claim 12 being a lidar sensor system, wherein the laser injection locked to the resonator is a source configured to generate an optical chirp in the lidar sensor system.

20. A method of injection locking a laser to a resonator, comprising:
emitting a light beam from the laser into a non-reciprocal optical assembly, wherein the light beam passes through the non-reciprocal optical assembly to the resonator with a first power loss, the resonator returns a feedback light beam to the laser such that the feedback light beam passes through the non-reciprocal optical assembly to the laser with a second power loss, the feedback light beam causes injection locking of the laser to the resonator to generate an injection locked light beam, the first power loss is tunable, the first power loss differs from the second power loss, and the non-reciprocal optical assembly non-reciprocally rotates a polarization angle of the light beam passing through the non-reciprocal optical assembly from the first port to the second port relative to a polarization angle of the feedback light beam passing through the non-reciprocal optical assembly from the second port to the first port; and outputting the injection locked light beam.

\* \* \* \* \*